US010733336B2

United States Patent
Stomakhin et al.

(10) Patent No.: US 10,733,336 B2
(45) Date of Patent: Aug. 4, 2020

(54) ADAPTIVE MATERIAL POINT METHOD

(71) Applicant: Disney Enterprises, Inc., Burbank, CA (US)

(72) Inventors: Alexey Stomakhin, Studio City, CA (US); Rajsekhar Setaluri, Stanford, CA (US)

(73) Assignee: Disney Enterprises, Inc., Burbank, CA (US)

( * ) Notice: Subject to any disclaimer, the term of this patent is extended or adjusted under 35 U.S.C. 154(b) by 357 days.

(21) Appl. No.: 14/996,333

(22) Filed: Jan. 15, 2016

(65) Prior Publication Data
US 2016/0210384 A1 Jul. 21, 2016

Related U.S. Application Data

(60) Provisional application No. 62/104,580, filed on Jan. 16, 2015.

(51) Int. Cl.
*G06F 30/20* (2020.01)
(52) U.S. Cl.
CPC .................................. *G06F 30/20* (2020.01)
(58) Field of Classification Search
CPC ....... G06F 17/5009; G06F 17/50; G06F 30/20
See application file for complete search history.

(56) References Cited

U.S. PATENT DOCUMENTS

| 2010/0277475 | A1* | 11/2010 | McAdams | G06T 13/40 345/420 |
| 2013/0096890 | A1* | 4/2013 | Vanderheyden | E21B 43/20 703/2 |
| 2017/0336522 | A1* | 11/2017 | Jiang | G01V 1/282 |

OTHER PUBLICATIONS

Stomakhin, Alexey, et al. "A material point method for snow simulation." ACM Transactions on Graphics (TOG) 32.4 (2013): 102. (Year: 2013).*

Steffen, Michael, Robert M. Kirby, and Martin Berzins. "Analysis and reduction of quadrature errors in the material point method (MPM)." International journal for numerical methods in engineering 76.6 (2008): 922-948. (Year: 2008).*

(Continued)

*Primary Examiner* — Aniss Chad
*Assistant Examiner* — Joshua E. Jensen
(74) *Attorney, Agent, or Firm* — Patterson + Sheridan, LLP

(57) ABSTRACT

An adaptive material point method for simulating and rendering of solid materials is disclosed. During each time step, a simulation application splits and/or merges particles according to a resolution of a grid and assigns properties to the split/merged particles. The simulation application then rasterizes particle information, including masses and velocities, to the grid, on which forces and/or collisions are computed to obtain updated velocities. Grid information, including the updated velocities, is then transferred back to the particles. The transfer from particles to grid and back from grid to particles may employ different transfer functions. In particular, a quadratic transfer function may be used to transfer information from the particles to the grid, while a linear transfer function may be used elsewhere, including to transfer information back from the grid to the particles. After updated velocities are transferred to the particles, the simulation application advects the particles using the updated velocities.

22 Claims, 4 Drawing Sheets

(56) References Cited

OTHER PUBLICATIONS

Hong, Woo-Suck et al. An adaptive sampling approach to incompressible particle-based fluid. Texas A&M University, 2009. (Year: 2009).*

Ando, Ryoichi, Nils Thürey, and Chris Wojtan. "Highly adaptive liquid simulations on tetrahedral meshes." ACM Transactions on Graphics (TOG) 32.4 (2013): 103. (Year: 2013).*

Ando, Ryoichi, Nils Thurey, and Reiji Tsuruno. "Preserving fluid sheets with adaptively sampled anisotropic particles." IEEE transactions on visualization and computer graphics 18.8 (2012): 1202-1214. (Year: 2012).*

Losasso, Frank, Frédéric Gibou, and Ron Fedkiw. "Simulating water and smoke with an octree data structure." ACM Transactions on Graphics (TOG). vol. 23. No. 3. ACM, 2004. (Year: 2004).*

Hong, Woosuck, Donald H. House, and John Keyser. "Adaptive particles for incompressible fluid simulation." The Visual Computer 24.7-9 (2008): 535-543. (Year: 2008).*

Stomakhin, Alexey, et al. "Augmented MPM for phase-change and varied materials." ACM Transactions on Graphics (TOG) 33.4 (2014): 138. (Year: 2014).*

Woosuck Hong et al., "An adaptive sampling approach to incompressible particle-based fluid", in EG UK Theory and Practice of Computer Graphics, Cardiff University, United Kingdom, 2009. Proceedings, pp. 69-76, 2009.

Frank Losasso et al., "Simulating water and smoke with and smoke with an octree data structure", in ACM SIGGRAPH 2004 Papers, SIGGRAPH '04, pp. 457-462, New York, NY, USA, 2004. ACM.

Emmanuel Brun, Arthur Guittet, and Frederic Gibou; "A local level-set method using a hash table data structure", J. Comput. Phys., 231(6):2528-2536, Mar. 2012.

H. Tan et al., "Hierarchical, Adaptive, Material Point Method for Dynamic Energy Release rate Calculations", Comput. Methods Appl. Mech. Engrg., 191, 2095-2109 (2002).

Ben Houston et al., "Hierarchical RLE level set: A compact and versatile deformable surface representation", ACM Trans. Graph., 25(1):151-175, 2006.

Matthias Teschner et al., "Optimized spatial hashing for collision detection of deformable objects", in VMV, pp. 47-54, 2003.

Ken Museth., "Vdb: High-resolution sparse volumes with dynamic topology", ACM Trans. Graph., 32(3):27:1-27:22, Jul. 2013.

G. P. Nikishkov, "Finite element algorithm with adaptive quadtree-octree mesh renement", in Rob May and A. J. Roberts, editors, Proc. of 12th Computational Techniques and Applications Conference CTAC-2004, vol. 46, pp. C-15-C28, Mar. 2005.

Rajsekhar Setaluri et al., "SPGrid: A sparse paged grid structure applied to adaptive smoke simulation" ACM Trans. Graph., Nov. 2014. (to appear).

Alexey Stomakhin et al., "A material point method for snow simulation", ACM Trans. Graph., 32(4):102:1-102:10, Jul. 2013.

Alexey Stomakhin et al., "Augmented mpm for phase-change and varied materials", ACM Trans. Graph., 33(4):138:1-138:11, Jul. 2014.

* cited by examiner

ADAPTIVE MATERIAL POINT METHOD

CROSS-REFERENCE TO RELATED APPLICATIONS

This application claims priority to U.S. provisional application having Ser. No. 62/104,580, filed on Jan. 16, 2015, which is hereby incorporated by reference in its entirety.

BACKGROUND

Field of the Invention

This disclosure provides techniques for computer simulation and rendering of physical phenomena. More specifically, one aspect of this disclosure presents an adaptive material point method for computer simulation and rendering of solids.

Description of the Related Art

Hybrid Lagrangian/Eulerian methods, in which particle and grid formulations are used in conjunction to simulate materials undergoing deformations, are commonplace in computer graphics simulations. The Material Point Method (MPM) is one such hybrid Lagrangian/Eulerian method, and the MPM has recently become a popular physically-based simulation tool in computer graphics and the movie effects industry, due to its ability to produce high fidelity visual results for wide ranges of materials properties. However, the high computational cost associated with MPM has limited its use.

SUMMARY

One aspect of this disclosure provides a computer-implemented method of simulating a system. The method generally includes, for one or more iterations: transferring, via a first transfer function, information characterizing masses and initial velocities of particles in the system from the particles to a grid; computing forces and/or collision responses on the grid, using a second transfer function, to obtain updated velocities; transferring, via the second transfer function, the updated velocities from the grid to the particles; and advecting the particles based on the updated velocities Further aspects include a non-transitory computer-readable storage medium storing instructions that when executed by a computer system cause the computer system to perform the methods set forth above, and a computer system programmed to carry out the methods set forth above.

BRIEF DESCRIPTION OF THE DRAWINGS

So that the manner in which the above recited aspects are attained and can be understood in detail, a more particular description of aspects of this disclosure, briefly summarized above, may be had by reference to the appended drawings.

It is to be noted, however, that the appended drawings illustrate only typical aspects and are therefore not to be considered limiting of its scope, for the invention may admit to other equally effective aspects.

To facilitate understanding, identical reference numerals have been used, where possible, to designate identical elements that are common to the figures. It is contemplated that elements and features of one aspect may be beneficially incorporated in other aspects without further recitation

DETAILED DESCRIPTION

Aspects presented herein provide an adaptive material point method (MPM) for simulating and rendering solid materials. In one aspect, a simulation application splits and/or merges particles according to a resolution of a grid and assigns material properties to the split/merged particles. The simulation application then rasterizes particle information, including masses and velocities, to the grid, on which forces and/or collisions are computed to obtain updated velocities. The simulation application further transfers grid information, including the updated velocities, back to the particles. The transfer from particles to grid and back from the grid to the particles may employ different transfer functions. In one configuration, a quadratic transfer function may be used to transfer information from the particles to the grid, while a linear transfer function may be used elsewhere, including to transfer information back from the grid to the particles. After updated velocities are transferred to the particles, the simulation application advects the particles using the updated velocities. Then another iteration of the simulation, in which the simulation application performs the same or similar operations, may commence, until some terminating condition.

Figure 1:
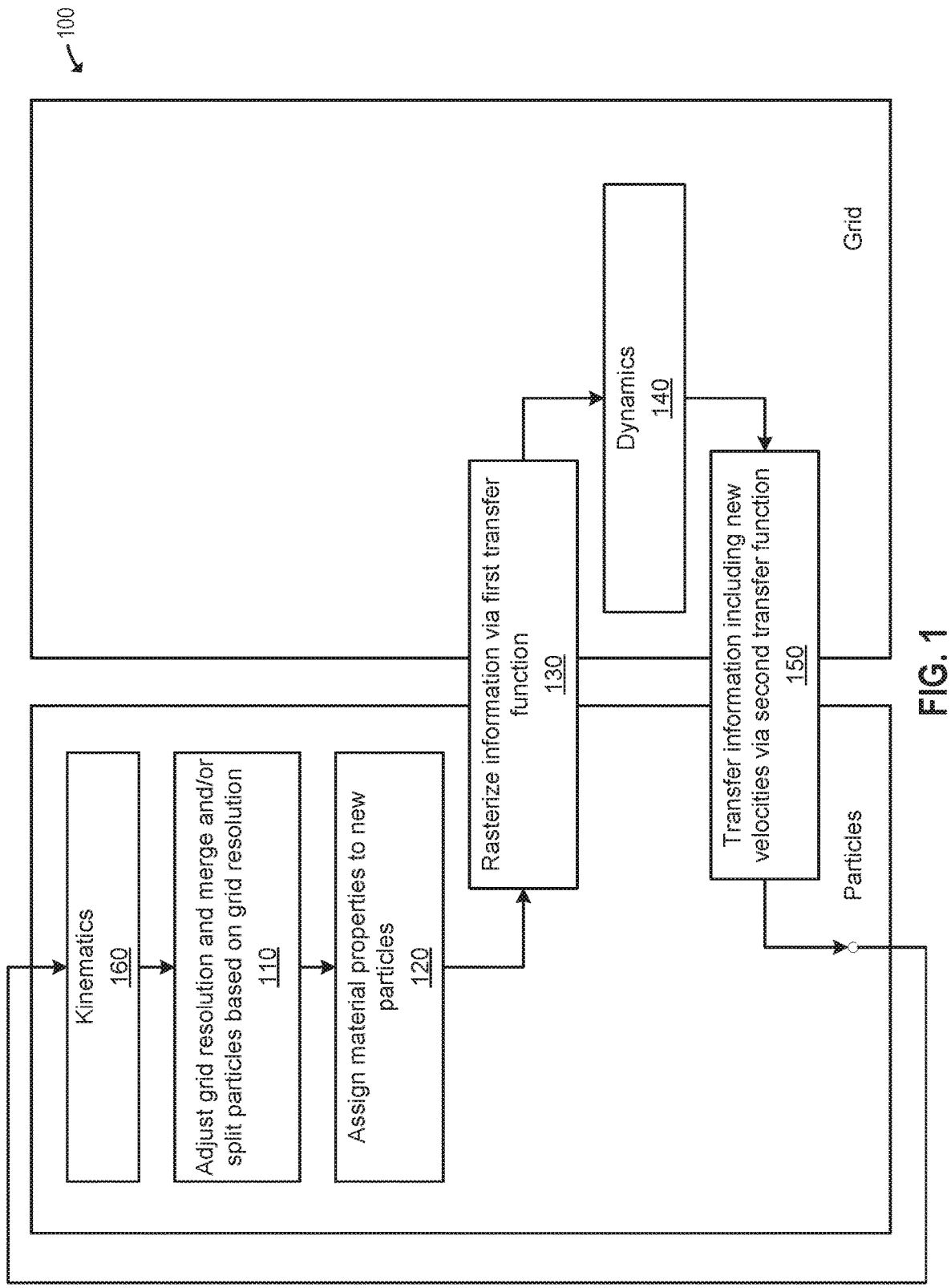
FIG. 1 illustrates an adaptive approach for simulating a system, according to an aspect of this disclosure.

FIG. 1 illustrates an adaptive approach for simulating a system, according to an aspect of this disclosure. The system may generally include any deformable solid material, such as snow, jelly, gummy bears, and the like. It will be understood that solid materials have memory and tend to return to their original shapes after being deformed. The adaptive MPM procedure disclosed herein permits simulation of such materials with memory, which requires accounting for more parameters and forces than those required in simulating memory-free materials such as liquids.

As discussed, the traditional MPM is a numerical procedure that allows simulations to be performed on a computer. In particular, the MPM augments particles used to simulate materials with a transient Eulerian grid for more efficient computing of derivatives and other quantities. That is, the particles are used to resolve transport and topological change, while the background Eulerian grid is used for computing mechanical forces and collision responses. While MPM can be used to simulate a wide range of material behaviors, traditional MPM is computationally expensive, and the use of MPM has been limited by its computational cost.

The adaptive MPM procedure disclosed herein improves upon the traditional MPM by focusing computational resources on certain important portions of the simulation. At each time step, the adaptive MPM may include the general steps of rasterizing mass and velocity from particles to a grid, computing forces and new velocities on the grid, and transferring the new velocities back from the grid to the particles, as well as adaptive enhancements such as splitting/merging of particles, different transfer functions for transferring data from particles to the grid and back, and increased grid and particle resolution in certain regions. As shown in FIG. 1, each time step of an adaptive MPM simulation 100 may begin with the simulation application adjusting the grid resolution and iterating over all particles and merging and/or splitting particles at 110, based on the grid resolution where the particles are located. That is, adaptivity is applied to the particle and grid degrees of freedom, as the complexity (and computational cost) of the system is dependent on the number of particle degrees of freedom and the grid degrees of freedom. It should be understood that the splitting and merging of particles for solids having memory must account for deformation information stored for each particle, which is different from memory-less materials such as liquids. As discussed in greater detail below, the simulation application may, in the merging and splitting interpolations, handle rotations and stretching separately after decomposing a deformation gradient into rotation and stretching components via a singular value decomposition.

The grid resolution, upon which the particle splitting and/or merging is based, may be defined statically (e.g., by the user) or computed dynamically during the simulation based, for instance, on the amount of dynamics in the system in each particular area. For example, in the case of a character walking through a bed of standing snow, it may be assumed that interesting visual detail is concentrated near the material-air surface (and in fact, only the surface may be visible). In such a case, a static adaptivity pattern may be used in which the material surface is highly refined, while regions away from the surface include less resolution. This is different from the traditional approach in which a user carefully sets up collision objects and places material only where the character was expected to step, which results in less volume and detail near the surface of the material as the entire bed of snow is not being simulated. As another example, in the case of a snowball colliding with a wall, it is also plausible that only the surface of the snowball contains interesting visual detail. In such a case, computational resources, e.g., grid and particle resolution, may be focused near the surface of the material. It should be understood that to maintain this property of the resolution being focused on the surface, the simulation application may need to change the areas of resolution dynamically, as the colliding snowball may disintegrate into pieces having various surfaces. For example, the simulation application may re-mesh every frame of the simulation to focus resolution on the surface. Other types of dynamic grid adaptivity are discussed in greater detail below.

The simulation application further assigns material properties to the new particles resulting from the merging and/or splitting at 120. For example, volume-weighted averaging may be used to compute properties of the new particles, such as stretching and elasticity properties and the Lamé parameters $\lambda$ and $\mu$, from the properties of the previous particles.

At 130, the simulation application rasterizes system information which is stored for particles to a grid via a quadratic transfer function. As used herein, "system information" refers to information that describes the physical (mechanical) system to be simulated, such as masses and velocities. As discussed in greater detail below, to transfer system information from a particle to the grid, the simulation application may look up nodes of the grid within a given radius of the particle and splat the particle to those nodes using quadratic weights that are normalized. The weights themselves may be computed by evaluating the transfer functions at the nodes within the rasterization radius of a particle.

At 140, dynamics, such as forces and collisions producing new velocities, are computed on the grid. Then at 150, system information, including the new velocities, is transferred back to the particles. Computing forces on the grid, computing new grid velocities using old grid velocities and grid forces via the solution of a linear system, and transferring the new velocities back to particles is also referred to as a "velocity update." In one configuration the simulation application may employ transfer function(s) in the velocity update steps that are different from the transfer function used to rasterize particle data to the grid. For example, linear transfer function(s) may be used in the velocity update. Thereafter, a kinematics update is performed at 160, in which the particles are advected (i.e., moved by advection) based on the new velocities transferred back from the grid.

Figure 2:
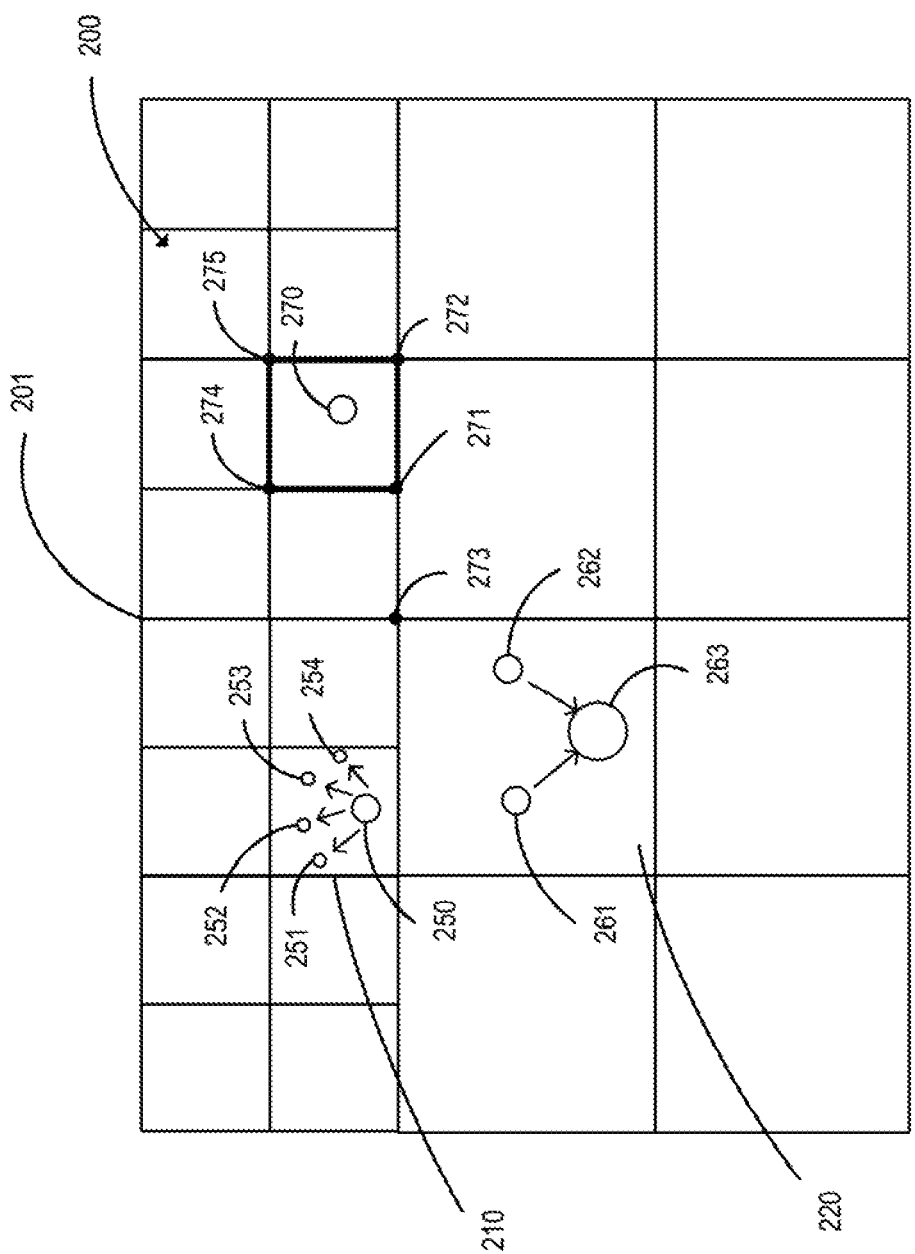
FIG. 2 illustrates modifications to the material point method for adaptivity, according to an aspect of this disclosure.

FIG. 2 illustrates modifications to the material point method for adaptivity, according to an aspect of this disclosure. As shown, regions of an Eulerian grid 200 are partitioned into finer or coarser grid cells, thereby providing greater or lesser resolution during a simulation. In one configuration, resolution of grid regions may be statically defined based on simulation depth of the region. As discussed, higher resolutions may be applied to grid regions near the material's surface that are visible, and vice versa. Such static resolutions may be user-defined or automatically determined. In another configuration, the simulation application may dynamically determine solutions of grid regions based on, e.g., distance of the regions from a material surface or other criteria evaluated at each iteration of the simulation.

In one configuration, SPGrid data structures may be used to store data of the grid 200, although techniques disclosed herein are not dependent on the choice of underlying data structure. With SPGrids in particular, it has been shown that an octree can be emulated using a stack of SPGrid data structures. Specifically, each undivided cell present in the geometric octree (i.e., leaf nodes of the octree) may be considered only at its native level of resolution. As a result, an octree may be completely represented using a stack of sparsely populated uniform grids, each of which may be stored using an SPGrid. With such an octree, multiple channels of data, potentially residing at different but nearby topological entities (e.g., cell-centers, face-centers, nodes) may be stored in the same data structure, and operations like stencil application and streaming access can reach very high bandwidth utilization and performance. In addition, SPGrid supports adaptive discretization of the grid with dynamically changing topology.

Illustratively, a particle 250 in fine cell 210 is split into four smaller particles 251-254, while particles 261-262 in coarse cell 220 are merged into a large particle 263. The simulation application may generally be configured to iterate over all particles and split and/or merge particles at each time step of the simulation based on the resolution of the cells in which the particles are located. In this manner, large particles that move into grid regions with fine resolution may be split into finer particles (i.e., fine particles in fine grid regions), and small particles that move into grid regions with coarse resolutions may be merged into larger particles (i.e., coarse particles in coarse grid regions). The simulation application may also assign material properties to the newly split or merged particles, such as stretching and elasticity properties and Lamé parameters and u, as discussed in greater detail below.

As further shown, the simulation application may account for situations such as the triple junction 271. A triple junction, also referred to as a T-junction or "hanging node,"

is a node of a finer cell that also belongs to an edge or to a face of a coarser cell. As shown, particle 270 is in a cell formed by nodes 271 and 272, 274, 275, of which node 271 is a T-junction. In this case, the T-junction node 271 cannot be used for interpolation from grid to particles, as it is not a degree of freedom (DOF), and instead nodes 272-275 may contribute to the interpolation from grid to particles, as discussed in greater detail below. Although the T-junction 271 is shown and discussed in 2D for simplicity, it should be understood that the discussion generalizes trivially to 3D.

Generally, any cell which is geometrically present may be designated an "active cell," or, equivalently, active cells may be leaves of the conceptual octree corresponding to the adaptive discretization. An active DOF may then be defined as satisfying the following properties: (1) it is a node (i.e., corner) of an active cell; and (2) it is not a T-junction node. Note that geometrically collocated nodes would not be multiply counted, as they may be identified by a single DOF. A T-junction node may be defined as follows: for a node i, consider the set, C, of the active cells touching node i, and node i is considered a T-junction node if there exists a cell c ∈ C such that i is not a corner of c. Visually, a T-junction node forms a "T" when considering the line segments that meet at this node. In one configuration, T-junction nodes may be excluded, as such nodes can cause inconsistencies and discontinuities in the discretization. In such a case, the simulation application may transform square elements into trapezoids to avoid using T-junction nodes as independent DOFs. For example, in the 2D case, the simulation application may use a weight to transfer information from grid nodes to particle p. To achieve a continuous discretization, the contribution of the T-junction may be replaced with contribution from the nodes from the corresponding coarser cell, which are in fact active DOF nodes. In general, in 2D or 3D, given a T-junction, there exists a neighboring (axis-aligned or diagonal) active DOF. The simulation application may divide the contribution of the T junction to its neighbors.

Figure 3:
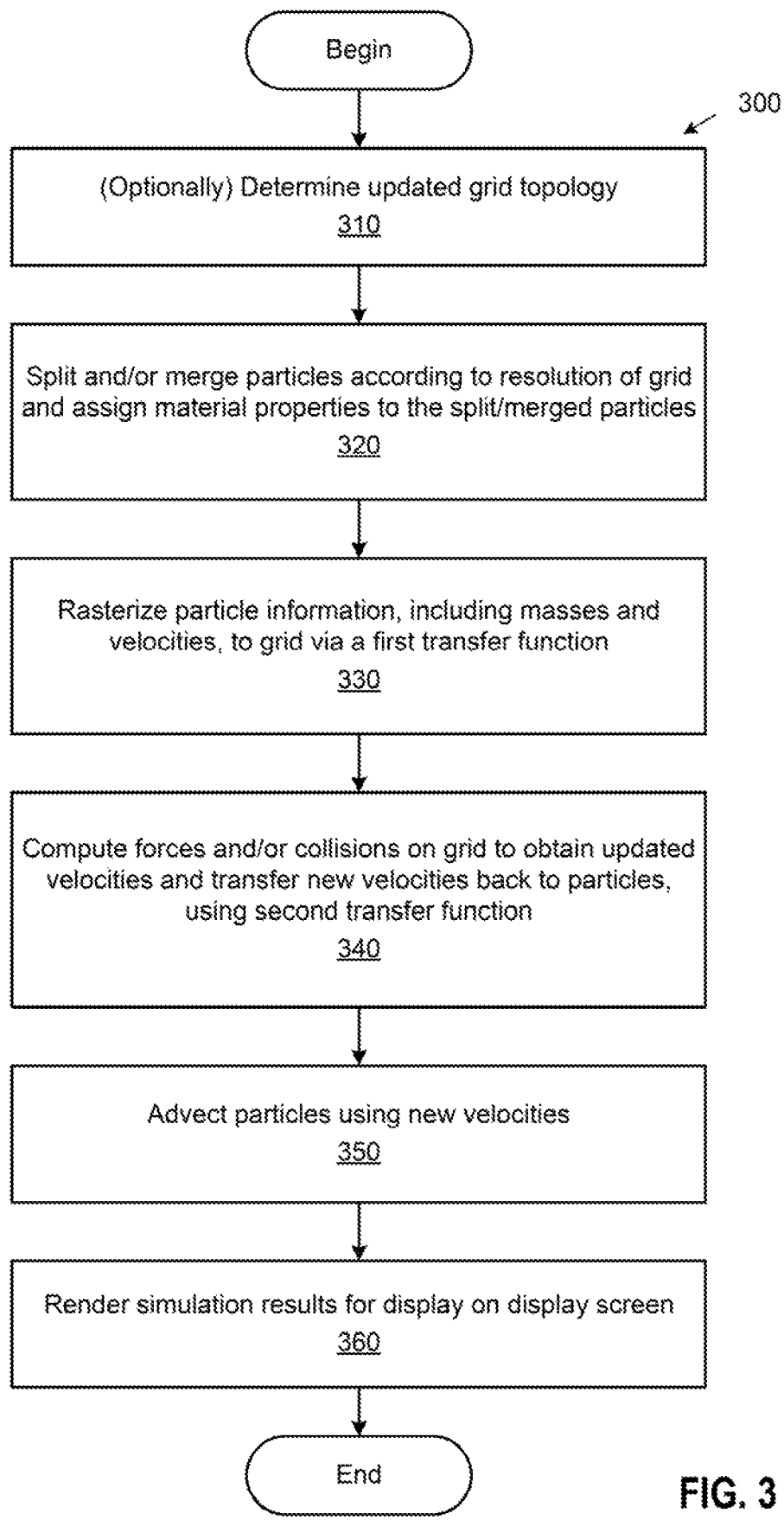
FIG. 3 illustrates an adaptive material point method for simulating a system, according to an aspect of this disclosure.

FIG. 3 illustrates a method 300 for simulating a system, according to an aspect of this disclosure. One iteration of the method 300 is shown for illustrative purposes, but it should be understood that an actual simulation may involve multiple iterations of one or more steps of the depicted method 300.

As shown, the method 300 begins at step 310, where a simulation application optionally determines an updated grid topology. As discussed, grid resolutions at different regions may either be defined statically or computed dynamically. Statically defined resolutions may include user-defined regions of refinement or coarsening that do not change during the simulation, and, in such a case, optional step 310 may be skipped. In contrast, the grid topology may also be driven dynamically based on current simulation state. For example, the simulation application may add resolution near areas of high velocities or high stresses, or based on some other simulation quantities. As another example, the simulation application may adapt the grid topology based on the geometric state of the simulation by, e.g., tracking the surface of the material and adding resolution near surface regions.

At step 320, the simulation application splits and/or merges particles according to resolution of the grid and assigns material properties to the split/merged particles. In one configuration, the simulation application may iterate over all particles. Where there are multiple too small particles relative to the size of the grid cell in which those particles lie, the simulation application may merge the particles. Conversely, where there are too large particles relative to the size of the grid cell, the simulation application may split the particles. To facilitate particle splitting and merging, another parameter, radius r may be added to the set of particle quantities. The radius r may be initialized as, e.g., $r=\sqrt[d]{V^0}$, where $V^0$ is the initial volume of a particle.

For particle splitting, when a particle p with radius $r_p$ enters a cell $c_h$ of size h, where $r_p > k^+(h)$, the simulation application splits such a particle into a set of children particles $\{p_j\}$. In one configuration, the particle may be split into $2^d$ children, where d=2,3 is the number of spatial dimensions. The splitting and merging criteria $k^+(h)$ and $k^-(h)$, respectively, may be precomputed and are functions of the size of the relevant grid cell. For each level of resolution on the adaptive grid, a particle radius lower bound and radius upper bound may be defined as, e.g., $$\frac{1}{e}$$

and e times the ideal particle radius (which is a function of h), respectively. In a particular aspect, c may be chosen to be e=3. In another configuration, dynamic criteria may be specified to lead to smoother and more stable splitting and merging. For example, it may be required that a particle needs to have traveled a certain distance into a region of different grid resolution before being split or merged, rather than doing so immediately.

The simulation application also needs to assign properties to the children particles that result from a splitting. Such properties may include: position x, velocity v, volume V, mass m, radius r, Lamé parameters $\lambda_0$ and $\mu_0$, critical compression $\theta_c$, critical stretch $\theta_s$, hardening coefficient deformation gradient F, and plasticity Jacobian $J_p = \det(F_p)$. Determination of these values may be based on the fact that each of the particles is meant to represent the nature of the large parent particle, but at higher resolution. In one configuration, the simulation application may copy all values from parent to children except m, V, r, and x, where the simulation application may set $m_{p_i} = m_p/2^d$, $V_{p_i} = V_p/2^d$ and $r_{p_i} = r_p/2$ so as to uniformly distribute the material to children particles. For the position x, the simulation application may let $x_{p_i} = x_p + r_p \hat{n}$, where $\hat{n}$ is a random unit vector. Essentially, children particles are seeded inside the sphere centered at $x_p$ with radius $r_p$, which represents the region previously occupied by the parent particle. For particle merging, when a small particle enters a larger cell $c_h$ such that $r_p < k^-(h)$, the simulation application seeks to merge particle p with a set of nearby particles $P = \{p_i\}$ to form a new, larger particle p*. Two issues make the merging process more complicated than the splitting process, discussed above. First, to merge a particle, the simulation application must find a set of nearby particles $P = \{p_i: \|x_{p_i} - x_p\|_2 < M_p\}$ with which to merge the particle, i.e., a search radius $M_p$ may be chosen and the radius searched for nearby particles. In one configuration, $M_p$ may be chosen to be the ideal particle radius, defined as the radius a particle would have had if it were originally seeded in cell $c_h$. This value can be precomputed and stored per grid resolution. In terms of the cost of actually searching for nearby particles, it should be noted that the naïve solution is O(n) per particle to be merged, where n is the number of particles. For a large number of particles to be merged, the combined search cost incurred by particle merging would be $O(n^2)$. In one configuration, the simulation application may amortize this search cost by using a particle bounding box hierarchy, which is an acceleration structure that allows efficient precomputing and storing of some amount of data regarding nearby particles. The value of using such a structure is directly related to the ratio of precomputing cost to expected use. In another configuration, the simulation application may only merge particle p with other particles at least as big as p. That is, P={$p_i$: $\|x_{p_i} - x_p\|_2 < M_p$, $r_{p_i} > r_p$}, which avoids separation artifacts near grid-resolution boundaries.

Second, new particle quantities must also be assigned when merging particles. That is, given a set of nearby particles P (note that this set includes the original particle), the simulation application needs to assign properties to the newly created particle p. For many of the quantities, there is physical motivation to perform a weighted averaging. In one configuration, the simulation application may perform a volume-weighted average for all of the quantities other than the Lamé parameters and the deformation gradient F. In another configuration, a mass-weight average may be used instead, although generally the mass and volume may be expected to differ by a constant factor. Particles may be seeded according to this approach, with the quantities changing only through splitting and merging. For example, for x, the simulation application may replace the set of particles being merged with a new particle located at their center of volume (or mass). For the Lamé parameters $\lambda_0$ and $\mu_0$, the simulation application may perform a harmonic volume-weighted averaging, according to the physical interpretation of these quantities. In addition, for the deformation gradient F, the simulation application may perform a more complicated procedure: decompose the deformation gradient of each particle to be merged via its singular value decomposition ($F_{p_i} = U_{p_i} \Sigma_{p_i} V_{p_i}^T$), and then individually average each component and multiply the components back to get the final value $F_p$. That is, the simulation application may handle rotations and stretching separately after decomposing the deformation gradient F into rotation and stretching components via the singular value decomposition. At a high level, the process may be described as $$F_p = \overline{U} \overline{E} (\overline{V})^T,$$

where $\overline{q}$ refers to some average (arithmetic mean, geometric mean, etc.) over all particles $p_i \in P$. The goal of this procedure is to average the rotational parts and singular values of F individually, and then combine them. As a result, U and V may be treated as rotations, and the simulation application may perform a volume-weighted average on their rotation vector analogs. Note that for V, the simulation application averages the quantity itself, as a rotation vector, and then converts it to a matrix and takes a transpose, rather than taking the averages of the transposed matrices. For $\Sigma$, the simulation application may individually take a volume-weighted average of each singular value, ordered by magnitude. Experience has shown that this is more effective than a stock, element-by-element weighted averaging of the matrix F in terms of the final result.

Additional and further modifications to the splitting and/or merging of particles are also contemplated. For example, in one configuration the splitting and merging process may be embellished with a hysteresis to reduce computational costs and avoid particles "jumping" between resolutions. In another configuration, particles may only be allowed to split but not merge so that resolution is never lost, only gained. In yet another configuration, the parameter averaging may be augmented so that particles that belong to fundamentally different pieces of types of material do not merge, e.g., if the Lamé parameters of two particles vary by a large degree, then those particles are not allowed to merge. In a further configuration, a more sophisticated approach may be used to seed children particles that guarantees a nice distribution of children properties.

At step 330, the simulation application rasterizes particle information, including masses and velocities, to a grid via a first transfer function. In the case of a uniform grid (non-adaptive case), the transfer weights $w_{ip}$ may be defined as $w_{ip} = N_i^h(x_p)$, where i=(i, j, k) is the index of a discrete grid node, p is a particle index, $x_p = (x_p, y_p, z_p)$ is the location of particle p, and h is the grid spacing. Further, $W_{ip} = \nabla N_i^h(x_p)$ and the transfer function $N_i^h(x_p)$ itself may be defined as the tensor product of one-dimensional B-splines N(x):

$$N_i^h(x_p) = N\left(\frac{1}{h}(x_p - ih)\right) N\left(\frac{1}{h}(y_p - jh)\right) N\left(\frac{1}{h}(z_p - kh)\right).$$

It should be understood that the transfer function is a function and denoted as N, while a weight w is a particular number obtained by evaluating the transfer function at a grid node location x, i.e. w=N(x). There is some flexibility in choosing N(x), with higher-order (and therefore wider) B-splines yielding more stable discretizations but inducing a higher computational cost. Experience has shown that use of a quadratic basis function to transfer particle information to the grid does not sacrifice overall stability while being less computationally expensive than higher order functions such as cubic B-splines. However, techniques disclosed herein may also use such higher order functions.

Consider a simulation quantity u that is native to a particle. A transfer function may be used in two scenarios. First, in a particle to grid transfer at step 330, the simulation application "evaluates" u at every grid node i. Given the transfer function N, the evaluation of u at every grid node i may be defined as $u_i = \Sigma_p w_{ip} u_p$. Secondly, in a grid to particle transfer, discussed with respect to step 350 below, the simulation application interpolates u at every particle, given u-values at grid nodes (i.e., $u_i$). In this case, the interpolation of u at particle p may be defined as $u_p = \Sigma_p w_{ip} u_i$. It should be understood that, for the overall discretization to conserve mass and momentum, it must be the case that $\forall i, \Sigma_p w_{ip} = 1$.

Further, since w has a small support, there is no need to sum over all particles or grid nodes all the time. For example, when using a uniform grid, all grid nodes that contribute a non-zero value to a particle at a fixed position can be known beforehand and trivially computed. Similarly, for a fixed particle p, grid nodes receive a non-zero contribution from particle p, so the simulation may fix a particle and contribute or accumulate values from surrounding grid nodes. However, difficulties arise for adaptive discretization. Namely, it becomes non-trivial to implement a high-order B-spline with wide support. In fact, the tensor product definition of $N_i^h$ does not translate directly to the adaptive case due to the non-uniformity of the grid. To alleviate these issues, three observations may be made: (a) the transfer kernels do not need to be defined via tensor products, as they can be defined otherwise, e.g., radially; (b) using linear (first-order) splines for N(x) is equivalent to multilinear interpolation and is amenable to adaptive discretizations, and most significantly (c) different transfer functions may be applied in different scenarios. In one configuration, the simulation application may make use of observation (c) by rasterizing quantities from particles to the grid at step 330 using a transfer function $N^{(1)}$ and use a different transfer function $N^{(2)}$ in other operations (with corresponding weights $w_{ip}^{(1)}$ and $w_{ip}^{(2)}$). That is, there is one function to transfer from particles to grid and a different function that can be chosen independently to transfer back from grid to particles. However, there is a caveat: the force computation on the grid needs to be consistent with and use the second transfer function, which is a constraint on how that the second function is chosen as the forces are computed on the adaptive grid and not every transfer function is compatible. In one embodiment, a (tri-)linear interpolation function may be used as the second transfer function to accommodate for adaptivity.

In general, $N^{(2)}$ having a wider support than $N^{(1)}$ is invalid, as this intuitively corresponds to the case where particles receive contributions from grid nodes that the particles did not rasterize to originally. Also, if the support of $N^{(1)}$ is significantly wider than that of $N^{(2)}$, then the simulation may suffer from dissipation, as this corresponds to a smoothing effect being applied. In one configuration, a quadratic basis function may be used for the rasterization at step 330 and linear basis functions used otherwise.

The step of rasterizing mass and velocity from particles (where they natively live) to grid nodes is essentially decoupled from the rest of the simulation steps, especially with respect to the transfer function used. Further, rasterization of mass and velocity happens only once per simulation step, which is in contrast to the transfer function used in the velocity update, where an iterative solver may be used. This suggests that $N^{(1)}$ can afford to have wider support (and therefore higher computational cost) than $N^{(2)}$, as discussed above. In the adaptive discretization context, the simulation application needs to use a different mechanism than that used in traditional MPM to identify grid nodes that are affected by a particle during rasterization. In one configuration, a spherical transfer function may be used for rasterization. Namely, for a particle p located at $x_p$, the simulation application identifies a set of "active" nodal degrees of freedom that are within some radius R of $x_p$. The transfer function is then a function of a single variable, $r_{ip}=\|x_p-x_i\|_2$, where $x_i$ is the location of grid node i (for notational purposes, i is used to enumerate the active nodal degrees of freedom in the adaptive grid, but i need not be a multidimensional index). In a particular configuration, the transfer function used may be a quadratic B-spline defined as follows, with $$\hat{r} = \left(\frac{3}{2}\right) r_{ip}:$$

$$w_{ip}^{(1)} = \begin{cases} \frac{1}{2}\hat{r}^2 + \frac{3}{2}\hat{r} + \frac{9}{8} : -\frac{3}{2} \le \hat{r} \le -\frac{1}{2} \\ -\hat{r}^2 + \frac{3}{4} : -\frac{1}{2} \le \hat{r} \le \frac{1}{2} \\ \frac{1}{2}\hat{r}^2 - \frac{3}{2}\hat{r} + \frac{9}{8} : \frac{1}{2} \le \hat{r} \le \frac{3}{2} \\ 0 : \text{otherwise} \end{cases}.$$

In such a case, the simulation application may identify active grid nodes that satisfy $\|x_p-x_i\|_2 < R$ (i.e., are within radius R of the particle) by computing the subset of grid nodes (at each level of resolution) that lie inside a bounding box of width 2R centered at $x_p$ and then selecting active nodes in this subset within a distance of R of $x_p$.

At step 340, the simulation application computes forces and/or collisions on the grid to obtain updated velocities that are then transferred back to the particles, using a second transfer function distinct from the first transfer function. After mass and velocity have been transferred from particles to the grid, the simulation application updates the velocities on the grid with forces and transfers the new velocities back to the particles according to a time integration scheme, such as a semi-implicit scheme (also referred to herein as the implicit solve). As discussed, such a "velocity update" may generally be broken down into the following steps: forces are computed on the grid, new grid velocities are computed using old grid velocities and grid forces via the solution of a linear system, and new velocities are transferred back to particles. The simulation application may use a second transfer function $N^{(2)}$ that is different from the first transfer function $N^{(1)}$ in the velocity update process (with corresponding weights $w_{ip}^{(2)}$ and $w_{ip}^{(1)}$). In addition, T-junctions may be handled by obtaining information from other nodes, as discussed in greater detail below.

In one configuration, a linear basis function may be used as the second transfer function. In such a case, for a particle p, the transfer function is equivalent to linearly interpolating from the nodes of the cell that contains particle p and, because this is a local transfer function (the support is a single grid cell), it does not depend on the uniformity of the entire grid. Certain restrictions may be placed on the second transfer function. First, $N^{(1)}$ should have wider support than $N^{(2)}$, and this is dependent on the choice of R, which should be large enough to encompass grid nodes of the cell containing particle p and therefore may be defined per particle ($R=R_p$). In particular, assuming particle p lies in a cell of size $h_p$, $R_p$ needs to be greater than the diagonal of a cube with side-length equal to $h_p$, i.e., $R_p > h\sqrt{d}$. Second, the difference in width support of $w_{ip}^{(1)}$ and $w_{ip}^{(2)}$ should be limited, i.e., this is not a strict requirement and represents a tradeoff between instability and dissipation. In one configuration, $R_p$ may be chosen as $$R_p = \frac{3}{2} h_p \sqrt{2}.$$

It should be understood that the velocity update involves handling T-junctions that go into the implicit solve. Consider a particle p located at $x_p$ that lies in cell c. Transferring from the grid to particles involves interpolating values $u_i$ from grid nodes to each particle p, to compute a $u_p$. To do this, the simulation application may first iterate over the set of all corners (nodes) of cell c, denoted by $\{N_I\}$, where the index $I \in \mathcal{O} \subset \mathbb{N}_0^3$ is the offset of a node from the back, left, and bottom corner of cell c; e.g., $\mathcal{O} = \{(0,0,0); (0,0,1); \ldots; (1,1,1)\}$ in 3 dimensions. Consider also the location of cell c with respect to its parent cell, denoted by $I_c^P \in \mathcal{O}$. The simulation application computes, for each $I \in \mathcal{O}$, a weight $w_I$ that would result from multilinear interpolation. If $N_I$ is an active DOF (not a T-junction), then the simulation application may simply add the value $w_I u_{N_I}$ to $u_p$.

On the other hand, if $N_I$ is a T-junction, there is no information on the node, as the node is not a DOF, and information needs to be obtained instead from other nodes. As discussed, to achieve a continuous discretization, the contribution of the T-junction may be replaced with contribution from the corresponding node of the adjacent coarse cell, which is in fact an active DOF node. In general, in 2D or 3D, given a T-junction, there exists a neighboring (axis-aligned or diagonal) active DOF. The simulation application may divide the contribution of the T junction to its two neighbors. Further, the simulation application may distribute the weight $w_I$ to nearby nodes, and the two nodes $\hat{N}^{(1)}$ and $\hat{N}^{(2)}$ that are located at offsets $(I-I_c^P)$ and $-(I-I_c^P)$ from the back, left, and bottom corner of cell c, are the two active nodal DOFs that assume the contributions from the T-junction nodes. This forms a new linear element for interpolation and corrects the inconsistencies and discontinuities that would occur at T-junction nodes. In one configuration, the octree data structure storing the grid, discussed above, may be graded, i.e., any two adjacent cells in the octree can differ at most by one level of resolution. In such a case, a cell of size h may only be adjacent to cells of size h/2, h, or 2 h. This implies that the aforementioned procedure to compute $\hat{N}^{(1)}$ and $\hat{N}^{(2)}$ will result in active nodal DOFs. The simulation application may proceed to add to $u_p$ the value $$\frac{1}{2} w_I u_{\hat{N}^{(1)}} + \frac{1}{2} w_I u_{\hat{N}^{(2)}}.$$

It will be understood that the functionality of the velocity update relies on the second transfer function and point-wise operations on the grid DOFs.

At step 350, the simulation application advects the particles using the new velocities. That is, after the velocity update in which new velocities are transferred from the grid to the particles, the simulation application uses the new velocities to move the particles through advection.

Thereafter, at step 360, the simulation application renders the simulation results for display on a display screen. Although rendering is shown as being performed on the fly as simulation data computed for each timestep becomes available, it should be understood that rendering may instead (and usually) be done after the entire simulation is completed.

Figure 4:
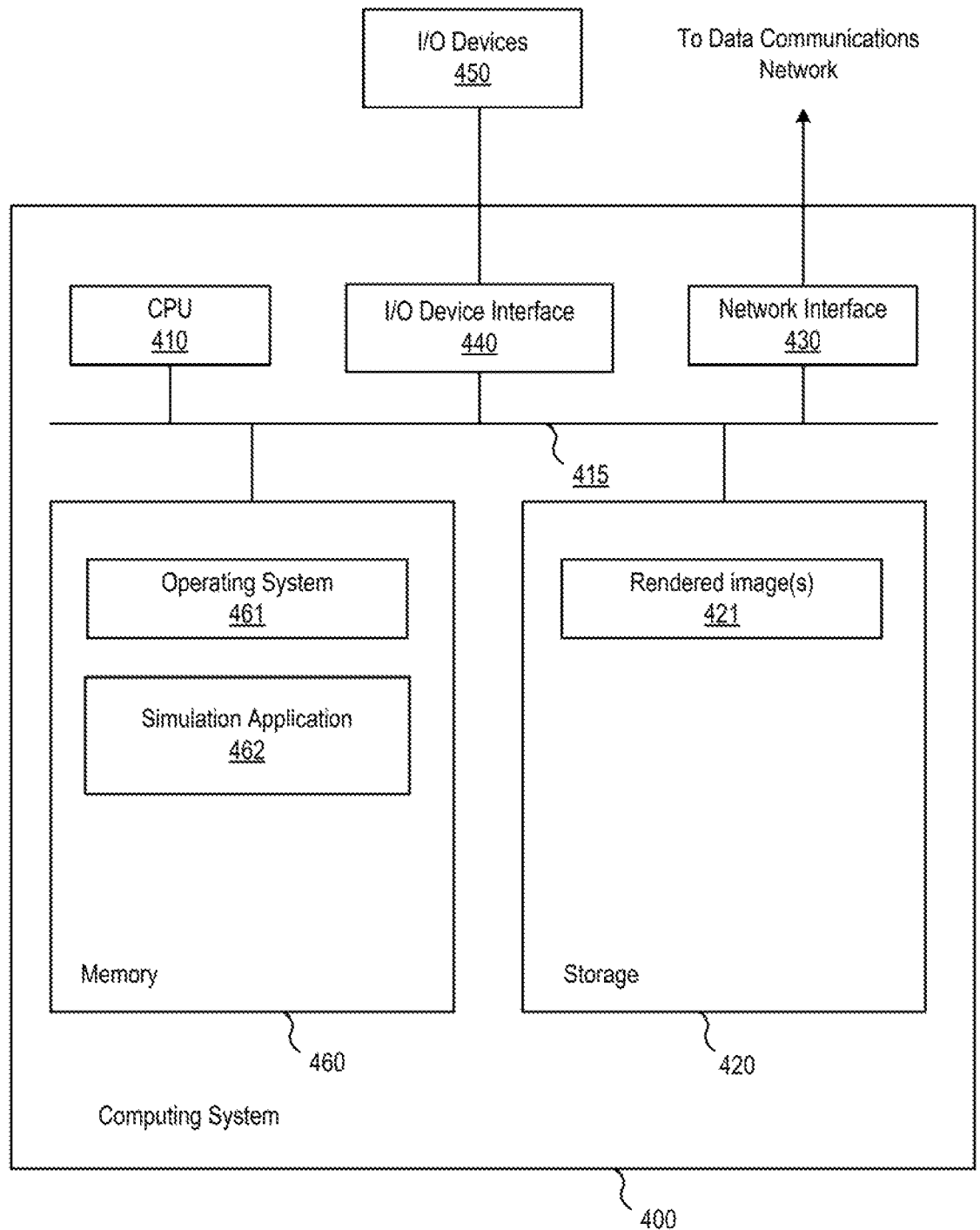
FIG. 4 illustrates a computer system in which an aspect of this disclosure may be implemented.

FIG. 4 depicts a block diagram of a computer system 400 in which an aspect of this disclosure may be implemented. As shown, the system 400 includes, without limitation, a central processing unit (CPU) 410, a network interface 430, an interconnect 415, a memory 460 and storage 420. The system 400 may also include an I/O device interface 440 connecting I/O devices 450 (e.g., keyboard, display and mouse devices) to the system 400.

The CPU 410 retrieves and executes programming instructions stored in the memory 460. Similarly, the CPU 410 stores and retrieves application data residing in the memory 460. The interconnect 415 facilitates transmission, such as of programming instructions and application data, between the CPU 410, I/O device interface 440, storage 420, network interface 430, and memory 460. CPU 410 is representative of one or more of a single CPU, multiple CPUs, a single CPU having multiple processing cores, one or more graphics processing units (GPUs), and the like. And the memory 460 is generally included to be representative of a random access memory. The storage 420 may be a disk drive storage device. Although shown as a single unit, the storage 420 may be a combination of fixed or removable storage devices, such as fixed disc drives, floppy disc drives, removable memory cards or optical storage, network attached storage (NAS), or a storage area-network (SAN). Further, system 400 is included to be representative of a physical computing system as well as virtual machine instances hosted on a set of underlying physical computing systems. Further still, although shown as a single computing system, one of ordinary skill in the art will recognized that the components of the system 400 shown in FIG. 4 may be distributed across multiple computing systems connected by a data communications network.

As shown, the memory 460 includes an operating system 461 and a simulation application 462. Illustratively, the operating system 461 may include Microsoft's Windows®. The simulation application 462 is configured to simulate solid materials with an adaptive material point method. In one configuration, the simulation application 462 may simulate the material by, for a number of iterations, determining an updated grid topology, splitting and/or merging particles according to resolution of a grid and assigning material properties to the split/merged particles, rasterizing particle information including masses and velocities to the grid via a first transfer function, computing forces and/or collisions on the grid that are transferred back to the particles using a second transfer function distinct from the first transfer function, advecting the particles using the new velocities, and rendering the simulation results to rendered image(s) 421 for display on a display screen, according to the method 300 discussed above with respect to FIG. 3.

Advantageously, techniques disclosed herein provide an adaptive material point method for computer simulation and rendering of solids, which have memory and require accounting for more parameters and forces than those required in simulating memory-free materials such as liquids. The adaptive MPM disclosed herein saves computation expenses in areas of lesser significance by employing adaptivity in both the grid and particles of the MPM, and adaptivity is further facilitated by use of different transfer functions to rasterize system information to the grid and to perform a velocity update, among other things.

In the foregoing, reference is made to aspects of this disclosure. However, it should be understood that the invention is not limited to specific described aspects. Instead, any combination of the foregoing features and elements, whether related to different aspects or not, is contemplated to implement and practice the invention. Furthermore, although aspects of this disclosure may achieve advantages over other possible solutions and/or over the prior art, whether or not a particular advantage is achieved by a given aspect is not limiting of the invention. Thus, the foregoing aspects, features, and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects of the present invention may be embodied as a system, method or computer program product. Accordingly, aspects of the present invention may take the form of an entirely hardware configuration, an entirely software configuration (including firmware, resident software, micro-code, etc.) or a configuration combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure are described with reference to flowchart illustrations and/or block diagrams of methods, apparatus (systems) and computer program products according to aspects of this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Aspects of this disclosure may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

The flowchart and block diagrams in the Figures illustrate the architecture, functionality, and operation of possible implementations of systems, methods and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to aspects of the present disclosure, other and further aspects may be devised without departing from the basic scope thereof, and the scope thereof is determined by the claims that follow.

What is claimed is:

1. A computer-implemented method of reducing a computational overhead in simulating and rendering deformable solid materials, the computer-implemented method comprising, for one or more iterations:

dynamically updating a topology of a grid in order to reflect a current geometric state of a simulation of a solid material being deformed over time, including decreasing a specified resolution for one or more non-surface regions of the solid material, the solid material having particles, each particle having a rasterization radius, wherein the grid having the updated topology comprises a non-uniform grid, which has a non-uniform resolution;

merging, based on the decreased resolution, two or more particles in the one or more non-surface regions of the solid material into one or more larger particles relative to the two or more particles;

rasterizing particle properties characterizing masses and initial velocities of the particles of the solid material, including the merged particles, by transferring, via a first transfer function, the particle properties from the particles to the non-uniform grid based on the rasterization radii of the particles;

computing at least one of forces and collision responses on the non-uniform grid by operation of one or more computer processors in order to obtain updated velocities, wherein the updated velocities are transferred from the non-uniform grid back to the particles of the solid material via a second transfer function different from the first transfer function, wherein the second transfer function is determined based on a compatibility constraint associated with the non-uniform grid; and subsequent to advecting the particles of the solid material based on the updated velocities, rendering one or more images based at least in part on the advected particles, wherein a computational overhead of the simulation is reduced based on the merged particles, wherein the one or more images are output for display.

2. The computer-implemented method of claim 1, wherein the first transfer function is a quadratic function, wherein the second transfer function is a linear function.

3. The computer-implemented method of claim 2, wherein the quadratic function is a spherical transfer function used to determine grid nodes within a predefined distance of each of the particles of the solid material.

4. The computer-implemented method of claim 1, further comprising assigning material properties to the merged particles.

5. The computer-implemented method of claim 4, wherein resolutions of one or more regions of the grid are predefined based on depth from one or more surface regions of the solid material.

6. The computer-implemented method of claim 4, further comprising dynamically modifying a resolution of at least one of the regions of the grid based on at least one of a distance from a material surface, velocity, and stress.

7. The computer-implemented method of claim 1, wherein the first transfer function includes normalized weights.

8. The computer-implemented method of claim 1, wherein transferring the updated velocities from the grid to the particles of the solid material includes transferring contributions of T-junctions in the grid to neighboring nodes in the grid.

9. The computer-implemented method of claim 1, wherein the particle properties are rasterized subsequent to updating the topology of the grid, wherein the specified resolution comprises a first specified resolution, wherein each of the first and second transfer functions is associated with a respective, distinct set of weights for particle transfer, wherein the computer-implemented method further comprises assigning material properties to the merged particles;

wherein updating the topology of the grid further includes
(i) tracking one or more surface regions of the solid material as the one or more surface regions change over time due to the solid material being deformed and (ii) increasing a second specified resolution for the one or more surface regions of the solid material.

10. The computer-implemented method of claim 9, wherein a higher resolution is applied proximate to the one or more surface regions of the solid material than in the one or more non-surface regions of the solid material, wherein the rasterization radius of each particle is based on a grid cell containing the respective particle, wherein the grid cell is of the grid, wherein the specified resolution comprises at least one of a grid resolution and a particle resolution;

wherein the particles including (i) a first set of particles that are split into finer particles when the first set of particles move from grid regions with lower resolution to grid regions with higher resolution and (ii) a second set of particles that are merged into coarser particles when the second set of particles move from grid regions with lower resolution to grid regions with higher resolution.

11. The computer-implemented method of claim 10, wherein the first transfer function is evaluated in order to determine first weights used in at least the transferring of the particle properties from the particles to the grid, wherein the second transfer function is evaluated in order to determine second weights used in at least the transferring of the updated velocities from the grid to the particles;

wherein the first transfer function comprises a quadratic function, wherein the quadratic function comprises a spherical transfer function used to determine grid nodes within a predefined distance of each of the particles of the solid material, wherein the second transfer function comprises a linear function.

12. The computer-implemented method of claim 11, wherein each of one or more particles of the solid material is split or merged based on a resolution of a region of the grid in which the respective particle is located, wherein resolutions of one or more regions of the grid are predefined based on depth from the one or more surface regions of the solid material, wherein the computer-implemented method further comprises:

dynamically modifying a resolution of at least one of the regions of the grid based on (i) a distance from a material surface, (ii) velocity, and (iii) stress.

13. The computer-implemented method of claim 12, wherein the specified resolution comprises the grid resolution and the particle resolution, wherein both the forces and the collision responses are computed, wherein the updated velocities are obtained by solving a linear system, wherein the computer-implemented method further comprises:

assigning a first plurality of material properties to the merged particles, the first plurality of material properties including a particle position, a particle velocity, a particle volume, a particle mass, a particle radius, Lame parameters, a critical compression, a critical stretch, a hardening coefficient, a deformation gradient, and a plasticity Jacobian, wherein the particle radius is initialized as a function of an initial particle volume;

wherein the first plurality of material properties is determined based on material properties of parent particles at least by (i) harmonic volume-weighted averaging of Lame parameters of the parent particles, (ii) decomposing deformation gradients of the parent particles into rotation and stretching components via singular value decomposition, wherein each of the rotation and stretching components is individually averaged by computing an arithmetic or geometric mean, whereafter the averaged components are multiplied in order to obtain the deformation gradient to assign, and (iii) volume-weighted or mass-weighted averaging of each of one or more material properties of the parent particles other than the Lame parameters and the deformation gradients.

14. The computer-implemented method of claim 13, further comprising copying one or more material properties from parent particles to the split particles;
wherein the first transfer function includes normalized weights, wherein transferring the updated velocities from the grid to the particles of the solid material includes transferring contributions of T-junctions in the grid to neighboring nodes in the grid;
wherein the quadratic function comprises a basis-spline function, wherein the two or more particles are identified based on a search, wherein the search is in turn based on a specified search radius, wherein the search is based further on a minimum particle size of at least one of the two or more particles, which reduces incidence of separation artifacts between different grid resolutions, wherein a computational overhead of the search is amortized based on a particle bounding box hierarchy, wherein the merging includes a hysteresis in order to reduce particle artifacts between different grid resolutions, wherein the computer-implemented method further comprises assigning a second plurality of material properties to the one or more particles of the solid material that are split;
wherein the solid material that is simulated comprises one or more snowballs as the one or more snowballs collide and disintegrate into smaller pieces of snow, wherein the grid comprises an Eulerian grid.

15. A non-transitory computer-readable medium storing a program executable to perform operations for reducing a computational overhead in simulating and rendering deformable solid materials, the operations comprising, for one or more iterations:
dynamically updating a topology of a grid in order to reflect a current geometric state of a simulation of a solid material being deformed over time, including decreasing a specified resolution for one or more non-surface regions of the solid material, the solid material having particles, each particle having a rasterization radius, wherein the grid having the updated topology comprises a non-uniform grid, which has a non-uniform resolution;
merging, based on the decreased resolution, two or more particles in the one or more non-surface regions of the solid material into one or more larger particles relative to the two or more particles;
rasterizing particle properties characterizing masses and initial velocities of the particles of the solid material, including the merged particles, by transferring, via a first transfer function, the particle properties from the particles to the non-uniform grid based on the rasterization radii of the particles;
computing at least one of forces and collision responses on the non-uniform grid by operation of one or more computer processors when executing the program, in order to obtain updated velocities, wherein the updated velocities are transferred from the non-uniform grid back to the particles of the solid material via a second transfer function different from the first transfer function, wherein the second transfer function is determined based on a compatibility constraint associated with the non-uniform grid; and
subsequent to advecting the particles of the solid material based on the updated velocities, rendering one or more images based at least in part on the advected particles, wherein a computational overhead of the simulation is reduced based on the merged particles, wherein the one or more images are output for display.

16. The non-transitory computer-readable medium of claim 15, wherein the first transfer function is a quadratic function, wherein the second transfer function is a linear function.

17. The non-transitory computer-readable medium of claim 16, wherein the quadratic function is a spherical transfer function used to determine grid nodes within a predefined distance of each of the particles of the solid material.

18. The non-transitory computer-readable medium of claim 15, wherein the operations further comprise assigning material properties to the merged particles.

19. The non-transitory computer-readable medium of claim 18, wherein resolutions of one or more regions of the grid are predefined based on depth one or more surface regions of the solid material.

20. The non-transitory computer-readable medium of claim 18, the operations further comprising dynamically modifying a resolution of at least one of the regions of the grid based on at least one of a distance from a material surface, velocity, and stress.

21. The non-transitory computer-readable medium of claim 15, wherein the first transfer function includes normalized weights.

22. A system of reducing a computational overhead in simulating and rendering deformable solid materials, the system comprising:
one or more computer processors; and
a memory including a program executable by the one or more computer processors to perform operations comprising, for one or more iterations:
dynamically updating a topology of a grid in order to reflect a current geometric state of a simulation of a solid material being deformed over time, including decreasing a specified resolution for one or more non-surface regions of the solid material, the solid material having particles, each particle having a rasterization radius, wherein the grid having the updated topology comprises a non-uniform grid, which has a non-uniform resolution;
merging, based on the decreased resolution, two or more particles in the one or more non-surface regions of the solid material into one or more larger particles relative to the two or more particles;
rasterizing particle properties characterizing masses and initial velocities of the particles of the solid material, including the merged particles, by transferring, via a first transfer function, the particle properties from the particles to the non-uniform grid based on the rasterization radii of the particles;
computing at least one of forces and collision responses on the non-uniform grid in order to obtain updated velocities, wherein the updated velocities are transferred from the non-uniform grid back to the particles of the solid material via a second transfer function different from the first transfer function, wherein the second transfer function is determined based on a compatibility constraint associated with the non-uniform grid; and
subsequent to advecting the particles based on the updated velocities, rendering one or more images based at least in part on the advected particles, wherein a computational overhead of the simulation is reduced based on the merged particles, wherein the one or more images are output for display.

* * * * *

UNITED STATES PATENT AND TRADEMARK OFFICE
CERTIFICATE OF CORRECTION

PATENT NO. : 10,733,336 B2
APPLICATION NO. : 14/996333
DATED : August 4, 2020
INVENTOR(S) : Alexey Stomakhin et al.

It is certified that error appears in the above-identified patent and that said Letters Patent is hereby corrected as shown below:

In the Specification

In Column 6, Line 10, delete "$\{p_j\}$." and insert -- $\{p_i\}$. --, therefor.

In Column 6, Line 35, after "coefficient" insert -- $\xi$, --.

In Column 7, Lines 7-8, delete "$P=\{p_i: \|x_{pi}-x_p\mu_2<M_p, r_{pi}>r_p\}$," and insert -- $P=\{p_i: \|x_{pi}-x_p\|_2<M_p, r_{pi}\geq r_p\}$, --, therefor.

In Column 7, Line 40, delete "$F_p=\overline{UE}(\overline{V})^T$," and insert -- $\boldsymbol{F_p = \overline{U}\overline{\Sigma}(\overline{V})^T}$, --, therefor.

In Column 8, Line 11, delete "$W_{ip}$" and insert -- $\nabla w_{ip}$ --, therefor.

In Column 8, Line 41, delete "$u_p=\Sigma_p w_{ip} u_i$." and insert -- $u_p=\Sigma_i w_{ip} u_i$. --, therefor.

Signed and Sealed this
Tenth Day of November, 2020

Andrei Iancu
*Director of the United States Patent and Trademark Office*